United States Patent
Youn et al.

(10) Patent No.: US 7,532,495 B2
(45) Date of Patent: May 12, 2009

(54) NONVOLATILE MEMORY DEVICE HAVING FLAG CELLS FOR STORING MSB PROGRAM STATE

(75) Inventors: Dong-Kyu Youn, Ansan-si (KR); Jin-Yub Lee, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 11/645,561

(22) Filed: Dec. 27, 2006

(65) Prior Publication Data

US 2008/0144380 A1   Jun. 19, 2008

(30) Foreign Application Priority Data

Dec. 13, 2006   (KR)   ............... 10-2006-0127270

(51) Int. Cl.
G11C 5/06   (2006.01)
(52) U.S. Cl. .............. 365/63; 365/185.03; 365/200; 365/189.05; 365/189.08
(58) Field of Classification Search ............ 365/63, 365/185.03, 200, 189.05, 189.08
See application file for complete search history.

(56) References Cited

U.S. PATENT DOCUMENTS

| | | | | |
|---|---|---|---|---|
| 5,930,172 A * | 7/1999 | Kucera | .................. | 365/185.21 |
| 6,366,487 B1 * | 4/2002 | Yeom | ......................... | 365/52 |
| 6,519,180 B2 | 2/2003 | Tran et al. | | |
| 6,643,180 B2 * | 11/2003 | Ikehashi et al. | ......... | 365/185.22 |
| 6,856,546 B2 | 2/2005 | Guterman et al. | | |
| 6,862,218 B2 | 3/2005 | Guterman et al. | | |
| 6,862,652 B1 * | 3/2005 | Tsuji | .......................... | 711/103 |
| 6,894,926 B2 | 5/2005 | Guterman et al. | | |
| 6,944,093 B2 * | 9/2005 | Sumitani | .................... | 365/235 |
| 7,082,056 B2 | 7/2006 | Chen et al. | | |
| 7,088,615 B2 | 8/2006 | Guterman et al. | | |
| 7,336,538 B2 * | 2/2008 | Crippa et al. | .......... | 365/185.12 |
| 2005/0060495 A1 * | 3/2005 | Pistoulet | ..................... | 711/118 |
| 2005/0204212 A1 * | 9/2005 | Noguchi et al. | ............. | 714/710 |
| 2007/0171711 A1 * | 7/2007 | Kang et al. | ............ | 365/185.03 |
| 2007/0253249 A1 * | 11/2007 | Kang et al. | ............ | 365/185.03 |
| 2008/0080237 A1 * | 4/2008 | Park | ...................... | 365/185.03 |
| 2008/0084739 A1 * | 4/2008 | Chae et al. | ............ | 365/185.03 |
| 2008/0089123 A1 * | 4/2008 | Chae et al. | ............ | 365/185.03 |
| 2008/0094893 A1 * | 4/2008 | Choi | .................... | 365/185.03 |
| 2008/0155364 A1 * | 6/2008 | Hwang | ....................... | 714/724 |

FOREIGN PATENT DOCUMENTS

| JP | 10-092195 | 4/1998 |
|---|---|---|
| JP | 2001-188711 | 7/2001 |
| JP | 2003-109396 | 4/2003 |
| JP | 2005-327359 | 11/2005 |

* cited by examiner

*Primary Examiner*—Viet Q Nguyen
(74) *Attorney, Agent, or Firm*—Volentine & Whitt, PLLC

(57) ABSTRACT

A nonvolatile memory device comprises a memory cell array comprising memory cells arranged in rows and first columns and flag cells arranged in the rows and second columns. The device further comprises a page buffer configured to read flag data bits from flag cells in a selected row via the second columns, and a judgment unit configured to judge whether memory cells in the selected row are programmed with MSB data based on the flag data bits read by the page buffer.

11 Claims, 8 Drawing Sheets

NONVOLATILE MEMORY DEVICE HAVING FLAG CELLS FOR STORING MSB PROGRAM STATE

BACKGROUND OF THE INVENTION

1. Field of Invention

Embodiments of the invention relate generally to semiconductor memory devices. More particularly, embodiments of the invention relate to nonvolatile memory devices and associated methods of operation.

A claim of priority is made to Korean Patent Application 2006-127270 filed on Dec. 13, 2006, the disclosure of which is hereby incorporated by reference in its entirety.

2. Description of Related Art

Two popular forms of flash memory devices include NAND flash memory devices and NOR flash memory devices. Compared with NAND flash memory devices, NOR flash memory devices typically have faster read times, slower write times, and a lower degree of integration. Due to these performance specifications, NOR flash memory devices are often used to provided storage for data that must be accessed quickly but is updated infrequently. For example, NOR flash memory devices are often used to provide storage for microcode in portable devices. On the other hand, due to its relatively higher storage and write performance, NAND flash memory devices are commonly used to provide mass data storage for devices such as digital cameras, PC cards, or even to replace hard disk drives.

In order to add even more data storage capacity to NAND flash devices, researchers have developed flash memory cells that are capable of storing more than one bit of data. Such memory cells are commonly referred to as "multi-level cells" and devices including multi-level cells are often referred to as multi-level cell (MLC) devices. As an example of a MLC, a two-bit flash memory cell can store two bits of data by varying the threshold voltage of the memory cell to four different states 11, 10, 01, and 00, which correspond to the data bits that they represent. The term "threshold voltage state" here denotes any threshold voltage with a value within a particular threshold voltage distribution. For example, FIG. 1 shows four different bell shaped threshold voltage distributions corresponding to four different threshold voltage states. The threshold voltage states represented in FIG. 1 provide an example of threshold voltage states that may be used in a two bit memory cell.

In FIG. 1, the leftmost threshold voltage distribution labeled "11" denotes an erased state of the memory cell. The memory cell is programmed by increasing its threshold voltage to change its threshold voltage state. Typically, such programming is accomplished by applying a program voltage (e.g., 14V-19V) to a control gate of the memory cell while grounding the channel of the memory cell. Under these bias conditions, a high electric field is formed between a floating gate of the memory cell and the channel, causing electrons to flow from the channel to the floating gate via an oxide film between the floating gate and the channel. Accumulation of electrons on the floating gate causes an increase in the memory cell's threshold voltage.

As illustrated in FIG. 1, a least significant bit (LSB) programming operation can be used to change the threshold voltage state of the memory cell from state "11" to state "10". On the other hand, a most significant bit (MSB) programming operation can be used to change the threshold voltage state of the memory cell from state "11" to state "01" or from state "10" to state "00".

FIG. 2 is a diagram illustrating read voltages used to determine the threshold voltage state of the two-bit memory cell during a read operation. Referring to FIG. 2, three different read voltages Vrd1, Vrd2, and Vrd3 can be used to distinguish between the four different threshold voltage states of the two-bit memory cell. Read voltage Vrd1 is set between −2.7 and 0.3 volts, read voltage Vrd2 is set between 0.7 and 1.3 volts, and read voltage Vrd3 is set between 2.3 and 2.7 volts.

In the read operation, the different read voltages are applied to the control gate of the memory cell while other voltages are applied to the source, drain, and channel of the memory cell. The threshold voltage state of the memory cell can be determined by measuring the amount of current that flows through the channel of the memory cell while each different read voltage is applied to the control gate. For simplicity of explanation, it will be assumed that when the level of the read voltage is less than the threshold voltage of the memory cell, no current will flow through the cell's channel. However, in practice the relationship between the read voltage, the threshold voltage, and the channel current in the memory cell may be more nuanced.

As an illustrative example, if current flows through the channel of the memory cell when read voltage Vrd1 is applied to the control gate, the threshold voltage of the memory cell is "11". If no current flows through the channel of the memory cell when read voltage Vrd1 is applied to the control gate, but current flows through the channel of the memory cell when read voltage Vrd2 is applied to the control gate, the threshold voltage of the memory cell is "10". If no current flows through the channel of the memory cell when read voltage Vrd2 is applied to the control gate, but current flows through the channel of the memory cell when read voltage Vrd3 is applied to the control gate, the threshold voltage of the memory cell is "01". Finally, if no current flows through the channel of the memory cell when read voltage Vrd2 is applied to the control gate the threshold voltage of the memory cell is "00".

In general, the threshold voltage states can be assigned to the different threshold voltage distributions in any arbitrary order. For example, the threshold voltage states could be reordered to increase in a gray coded order and so on. However, those skilled in the art will recognize that certain orderings of threshold voltage states have valuable characteristics. For example, in the illustrating of FIG. 2, one can determine whether or not the MSB of the memory cell is programmed simply by applying read voltage Vrd2 to the control gate and detecting the amount of current flowing through the channel of the memory cell. Such a process of using the one read voltage to determine the state of the MSB in a memory cell may be referred to as a MSB read algorithm. Similarly, a process of applying a combination of read voltages to determine the state of the LSB in a memory cell may be referred to as a LSB read algorithm.

FIG. 3 is a block diagram illustrating a conventional nonvolatile memory device, and FIG. 4 is a circuit diagram showing a structure of a memory cell array illustrated in FIG. 3.

Referring to FIG. 3, a conventional nonvolatile memory device 100 comprises a memory cell array 110, a row decoder 130, and a page buffer 140. Memory cell array 110 comprises a plurality of memory cells capable of storing data. Each of the memory cells is a multi-level cell that can store multiple bits of data. Memory cell array 120 further comprises a flag cell string 120 for storing store flag information indicating whether memory cells in each row have been programmed with MSB data (i.e., whether the memory cells have been "MSB programmed").

As illustrated in FIG. 4, memory cell array 110 comprises a plurality of strings 111 connected to respective bit lines BL0-BLn. Each string 111 comprises a string select transistor SST, a ground select transistor GST, and memory cells MC0-MCm connected in series between select transistors SST and GST. The string select transistors SST in respective strings 111 are all connected to a string select line SSL, the ground select transistor GST in respective strings 111 are all connected to a ground select line GSL, and the memory cells MC0-MCm in respective strings 111 are all connected to corresponding word lines WL0-WLm.

Flag cell string 120 is connected to a flag bit line FBL, and has structure similar to strings 111. In particular, flag string 120 comprises a string select transistor SST, a ground select transistor GST, and flag cells MC0-MCm connected in series between select transistors SST and GST. The string select transistor SST in flag cell string 120 is connected to string select line SSL, the ground select transistor GST in flag cells string 120 is connected to ground select line GSL, and flag cells MC0-MCm are respectively connected to word lines WL0-WLm. Each of flag cells MC0-MCm in flag cell string 120 may store flag data indicating whether memory cells in a corresponding row (i.e., connected to the same word line) in memory cell array 110 have been programmed with MSB data.

Row decoder 130 controls the voltage levels of word lines WL0-WLm, string select line SSL, and ground select line GSL according to operating modes of the device. In FIG. 4, memory cell array 110 corresponds to one memory block; however, it could be expanded to comprise multiple memory blocks. Accordingly, row decoder 130 may perform a function of selecting a memory block and controlling word lines and select lines in the selected memory block. Page buffer 140 may be configured to read data from memory cell array 110 in a read operation and to program data into memory cell array 110 during a program operation. During a MSB program operation, a flag cell connected to a selected word line may be programmed with flag data via page buffer 140.

As described above, a nonvolatile memory device may determine whether memory cells in a selected row have been programmed with MSB data. This determination, in turn, can be used to inform an algorithm for reading data stored in the selected memory cells.

As illustrated in FIG. 4, one flag cell is used to store flag data for memory cells in each row of memory cell array 110. Unfortunately therefore, where the flag cell connected to a selected word line is defective or erroneous, it may be impossible to detect whether memory cells in the selected word line have been programmed with MSB data using the flag cell. This in turn may lead to read errors. In addition, the inability to determine whether a MSB program operation has been correctly performed may impair reading of LSD data. As a result, the reliability of the nonvolatile memory device as a whole may be impaired.

SUMMARY OF THE INVENTION

According to one embodiment of the invention, a nonvolatile memory device comprises a memory cell array comprising memory cells arranged in rows and first columns, and flag cells arranged in the rows and one or more second columns. The memory device further comprises a page buffer configured to read one or more flag data bits from one or more flag cells in a selected row among the rows via the one or more second columns, and a judgment unit configured to judge whether memory cells in the selected row are programmed with MSB data based on the one or more flag data bits read by the page buffer.

BRIEF DESCRIPTION OF THE DRAWINGS

Embodiments of the invention are described below in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
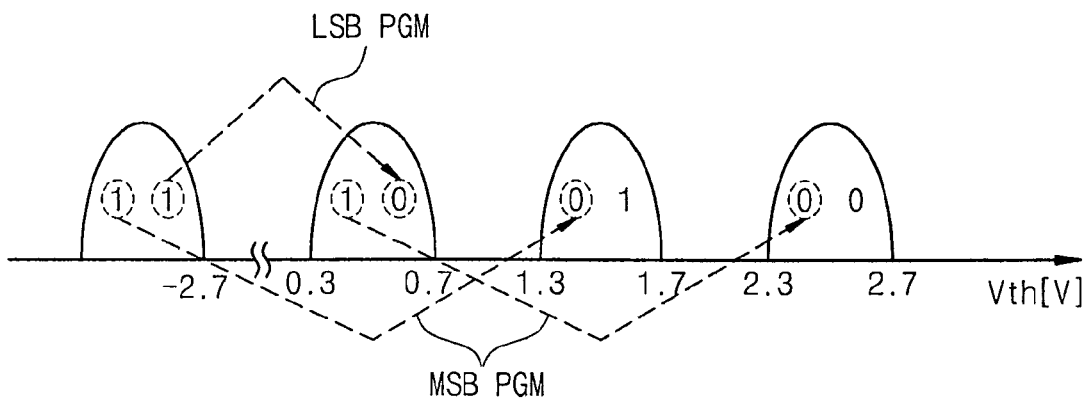
FIG. 1 is a diagram illustrating threshold voltage distributions of a multi-level nonvolatile memory cell.
Figure 2:
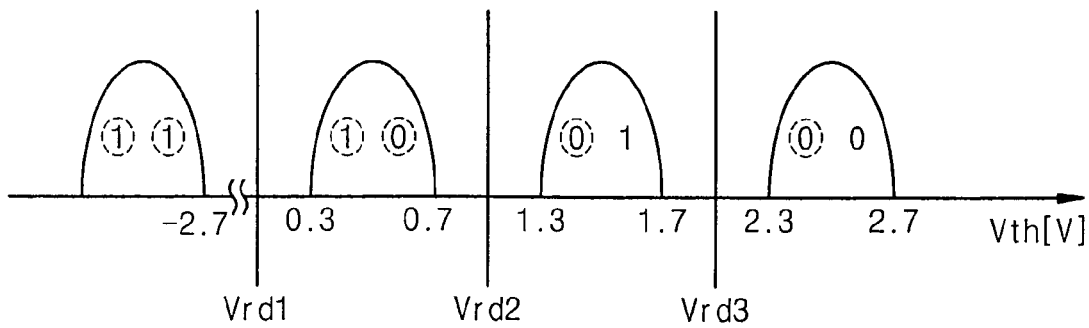
FIG. 2 is a diagram illustrating a read operation of a multi-level cell having the threshold voltage distributions illustrated in FIG. 1.
Figure 3:
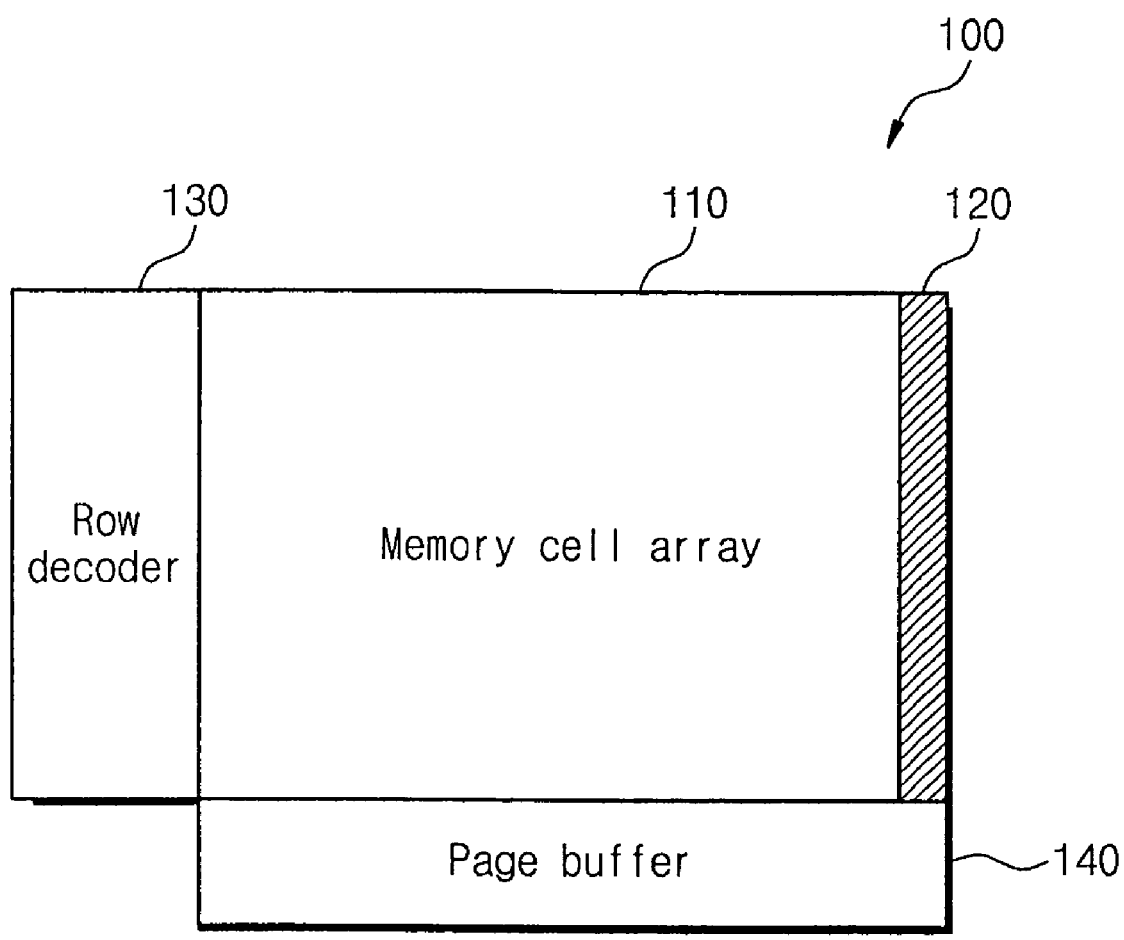
FIG. 3 is a block diagram showing a memory cell array of a conventional memory device.
Figure 4:
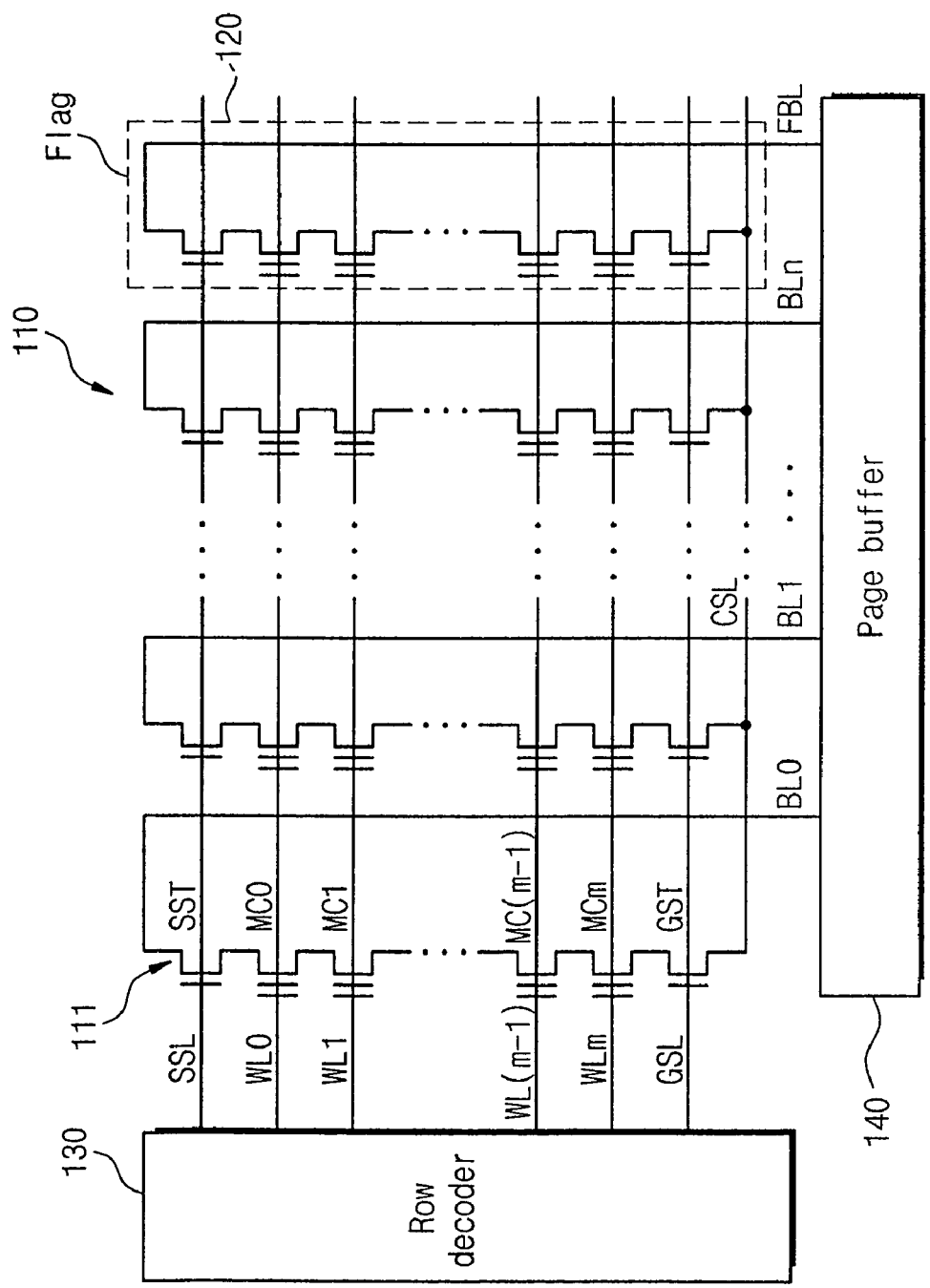
FIG. 4 is a circuit diagram showing a structure of a memory cell array illustrated in FIG. 3.
Figure 5:
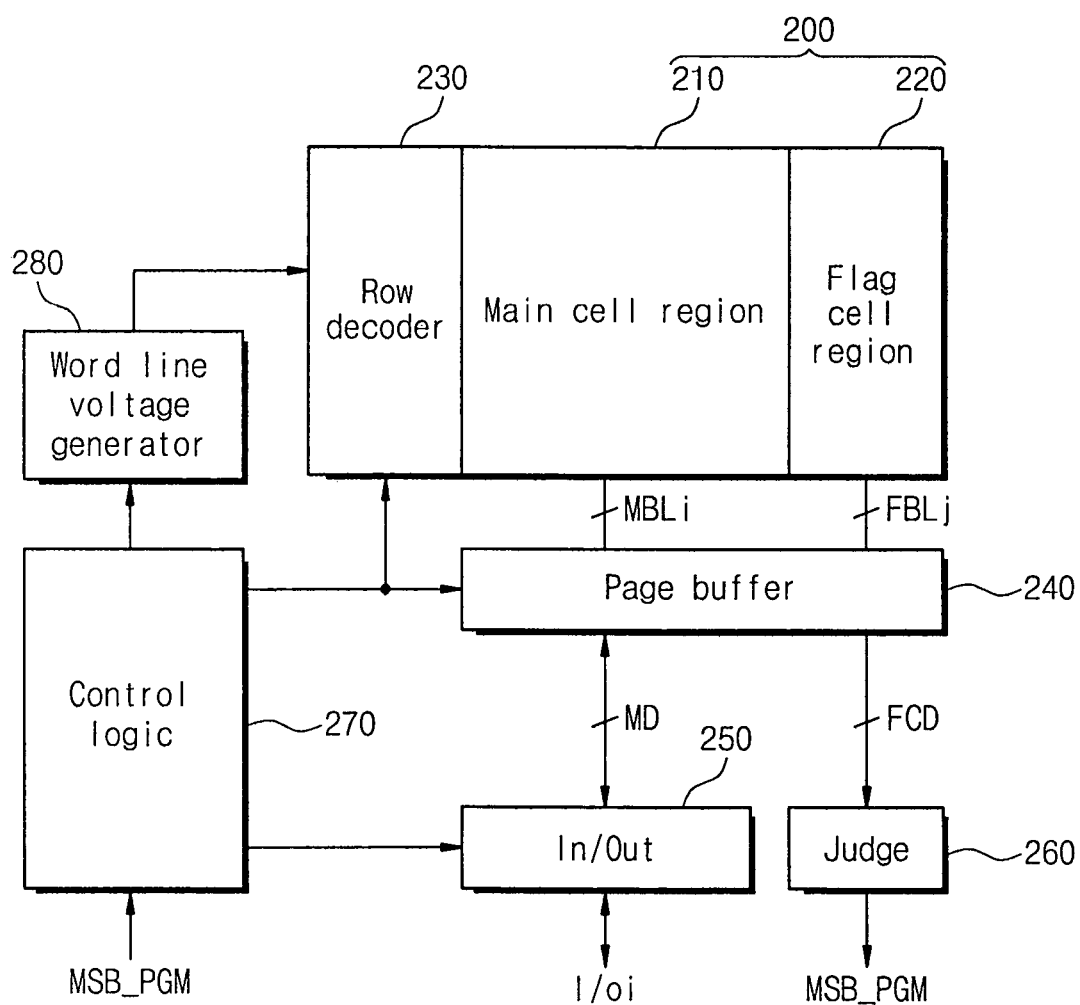
FIG. 5 is a block diagram showing a nonvolatile memory device according to one embodiment of the invention.
Figure 6:
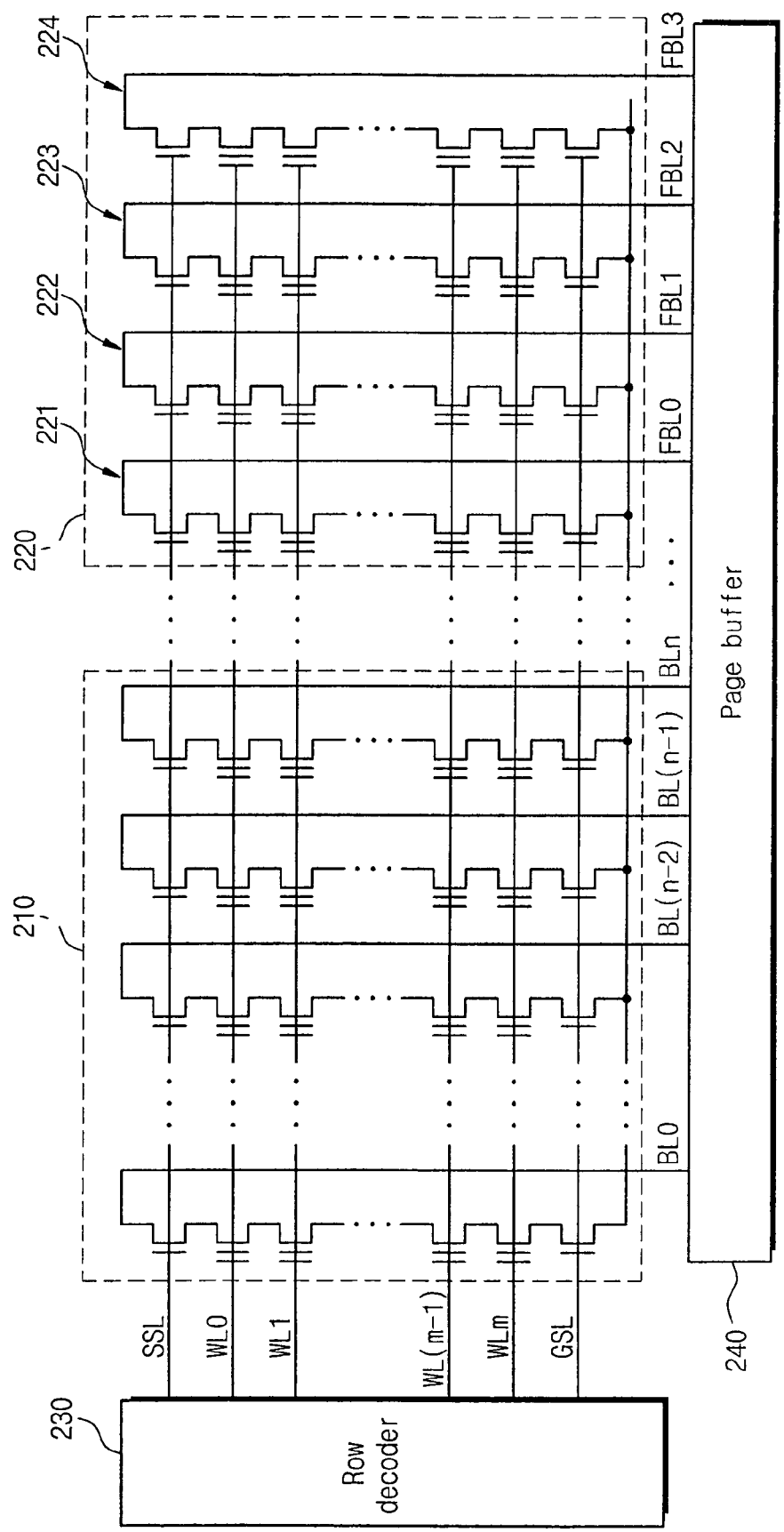
FIG. 6 is a circuit diagram showing a structure of a memory cell array illustrated in FIG. 5.

FIG. 5 is a block diagram illustrating a nonvolatile memory device according to one embodiment of the present invention, and FIG. 6 is a circuit diagram illustrating a structure of a memory cell array illustrated in FIG. 5.

Referring to FIG. 5, a nonvolatile memory device according to one embodiment of the invention comprises a memory cell array 200, a row decoder 230, a page buffer 240, a data input/output unit 250, a judgment unit 260, control logic unit 270, and a word line voltage generator 280. In general, many of the block units illustrated in the drawings can be implemented as circuits. However, those skilled in the art will recognize that at least some functions of these block units can be implemented by combining both software and hardware.

Memory cell array 200 comprises a memory cell region 210 and a flag cell region 220. Memory cell region 210 and flag cell region 220, as illustrated in FIG. 6, correspond to one memory block. However, those skilled in the art will recognize that memory cell array 200 may be formed of multiple memory blocks.

In one example, flag cell region 220 comprises four flag cell strings 221, 222, 223 and 224 connected to four corresponding flag bit lines FBL0, FBL1, FBL2 and FBL3, respectively. Where memory cells in a selected row/word line of memory cell array 200 are programmed with MSB data, four flag cells connected to the selected row/word line are simultaneously programmed to have a threshold voltage state indicating that MSB programming has occurred. For example, a properly functioning flag cell will store state "01" or "00" after MSB programming has occurred in a corresponding row of memory cell array 200.

Row decoder unit 230 is controlled by control logic unit 270, and may drive word lines of memory cell array 200 with corresponding word line voltages in response to a row address. Page buffer 240 is controlled by control logic unit 270, and may be constructed to read data from the memory cell region 210. Further, page buffer 240 may be configured to read flag data from flag cells in flag cell region 220 in the selected row/word line. Main data read by page buffer 240 may be output via data input/output unit 250. On the other hand, flag data read by page buffer 240 may be provided to judgment unit 260, which may judge whether memory cells in the selected row are MSB programmed, in response to the received flag data. As a judgment result, judgment unit 260 may output a judgment signal MSB_PGM to control logic unit 270.

Control logic unit 270 may be configured to control an overall operation of the nonvolatile memory device. For example, control logic unit 270 may control word line voltage generator 280 and page buffer 240 in response to judgment signal MSB_PGM. As explained above, different LSB read algorithms and MSB read algorithms may be used to detect the respective states of the LSB and MSB of a memory cell. Accordingly, control logic unit 270 may select a LSB or MSB read algorithm based on judgment signal MSB_PGM and control word line voltage generator 280 and page buffer 240 according to the selected read algorithm. Word line voltage generator 280 is controlled by control logic unit 270, and may be configured to generate word line voltages according to a mode of operation. The word line voltages may be supplied to row decoder 230.

It is possible to improve the reliability of flag data stored in flag cells by storing flag data for each row/word line in multiple flag cells.

Figure 7:
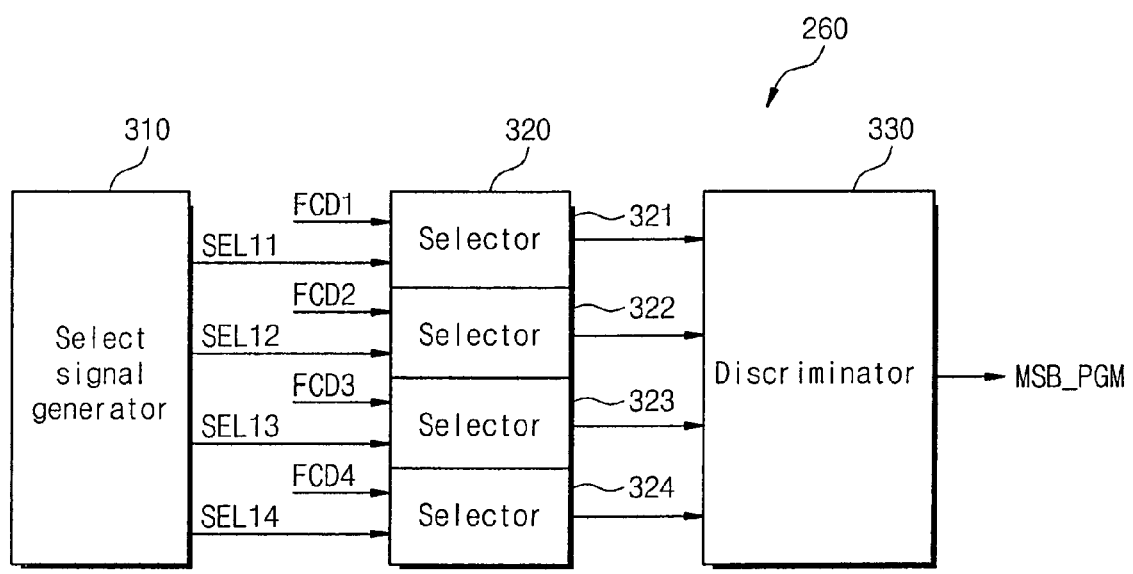
FIG. 7 is a block diagram illustrating an embodiment of a judgment unit illustrated in FIG. 5.

FIG. 7 is a block diagram showing an embodiment of a judgment unit illustrated in FIG. 5.

Referring to FIG. 7, judgment unit 260 comprises a select signal generator unit 310, a selector unit 320, and a discriminator unit 330. Select signal generator unit 310 may generate a plurality of first select signals SELL11-SEL14 corresponding to flag cell strings 221-224 based on whether flag cell strings 221-224 operate normally.

For example, in an event where one of flag cell strings 221-224 (e.g., 224) includes a defective flag cell or a flag cell operating abnormally, a value of first select signal SEL14 corresponding to flag cell string 224 may be set to '1'. Otherwise, first select signal SEL14 may be set to '0'.

Select signal generator unit 310 may comprise a plurality of fuses that are selectively cut based on whether flag cell strings 221-224 operate normally. Accordingly, first select signals SELL11-SEL14 may be set to different values (for example, logic state '1' or '0') based on whether or not corresponding fuses have been cut.

For example, select signal generator unit 310 may output a logic value '1' where a fuse corresponding to an abnormal flag cell string is cut, and a logic value '0' where the fuse corresponding to a normal flag cell string. Fuses corresponding to flag cell strings 221-224 may be cut selectively according to a wafer-level test result.

Selector unit 320 comprises a plurality of selectors 321-324 corresponding to flag cell strings 221-224, respectively. Selectors 321-324 operate responsive to corresponding select signals SEL11-SEL14, and receive flag data FCD1-FCD4 read from flag cell strings 221-224. In respective selectors 321-324, received flag data may be selectively output according to a corresponding select signal.

For example, each of selectors 321-324 may output data read from a corresponding flag cell string when a corresponding select signal has a logic level "low" ('0'). Each of the selectors 321-324 may output logic state '0' when a corresponding select signal has a logic level "high" ('1'). Accordingly, in judging whether memory cells in a selected row/ word line have been MSB programmed, selector unit 320 may exclude from consideration flag data read from an abnormal flag cell string.

Discriminator unit 330 may judge whether memory cells in a selected row/word line are programmed with MSB data based on output signals from selectors 321-324. For example, where at least one of the output signals from selectors 321-324 has logic state '1', discriminator unit 330 may judge the memory cells in the selected row to be programmed with MSB data. Alternatively, where a majority of the output signals of selectors 321-324 have logic state '1', discriminator unit 330 may judge the memory cells in the selected row to be programmed with MSB data. Alternatively, discriminator unit 330 may use other methods of analyses on the output signals of selectors 321-324 (e.g., unanimity, etc.) to judge whether the memory cells in the selected row are programmed with MSB data.

As a result, judgment unit 260 according to one embodiment of the invention can improve the reliability of flag data by disregarding flag data read from abnormal flag cell strings and reading flag data from a plurality of flag cell strings. Based on a judgment result of flag data thus obtained, the nonvolatile memory device may select and perform an algorithm for reading data stored in memory cells of a selected row.

Figure 8:
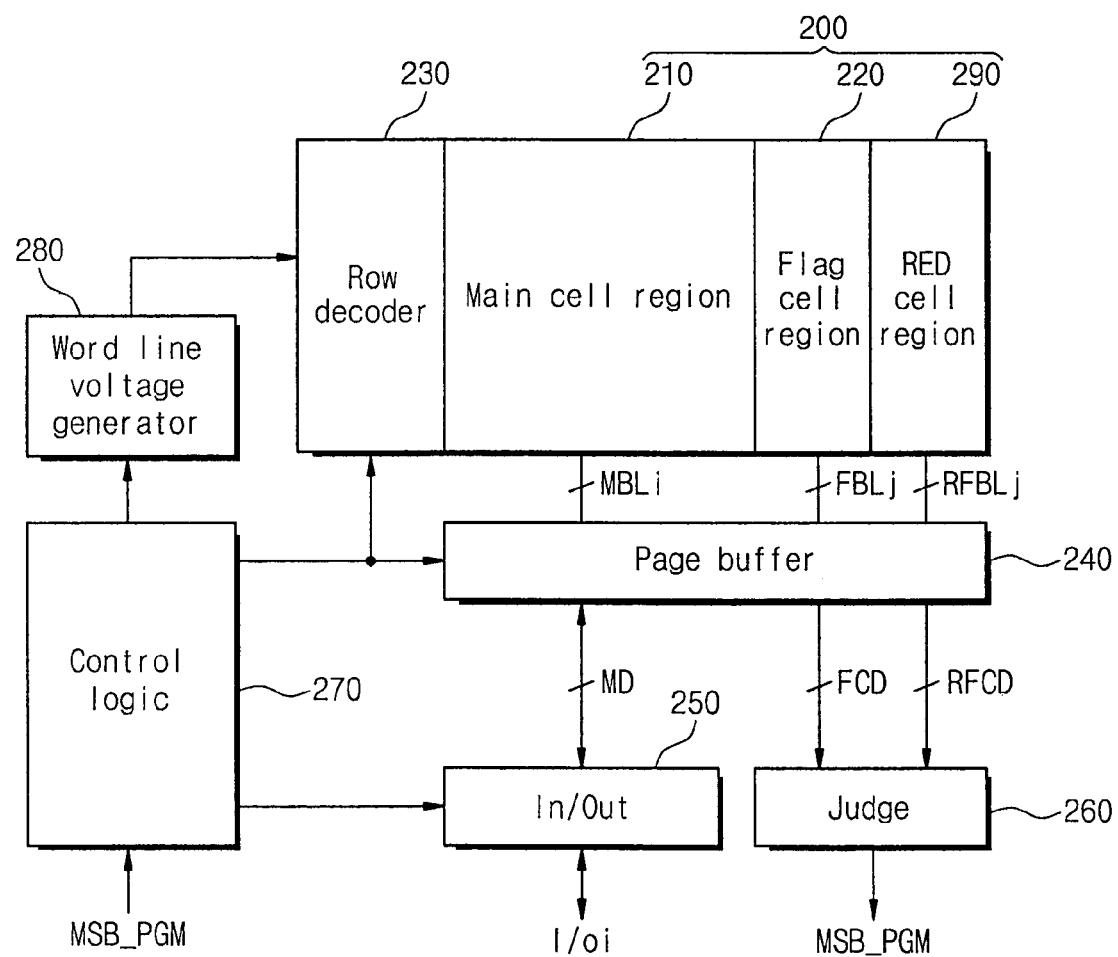
FIG. 8 is a block diagram showing a nonvolatile memory device according to another embodiment of the invention.

FIG. 8 is a block diagram illustrating a nonvolatile memory device according to another embodiment of the present invention. In FIG. 8, elements which have the same functions as those in FIG. 5 are marked by the same numerals, and therefore additional descriptions thereof will be omitted to avoid redundancy.

Referring to FIG. 8, memory cell array 200 further comprises a redundant cell region 290 for replacing flag cell strings in flag cell region 220. In one embodiment, redundant cell region 290 comprises a number redundant cell strings that is the same as the number of flag cell strings in flag cell region 220. Before a read operation of memory cell region 210 is carried out, page buffer 240 may read data (i.e., flag cell data and redundant cell data) from cells of flag and redundant cell regions 220 and 290 in a selected row/word line under the control of control logic unit 270. The read data may be output to judgment unit 260. Judgment unit 260 may judge an MSB program state based on flag cell data or redundant cell data that is selected according to program information. As a judgment result, judgment signal MSB_PGM may be transferred to control logic unit 270. As described above, cells of flag and redundant cell regions 220 and 290 in a selected row/word line may be programmed with flag data via page buffer 240 under the control of control logic unit 270 in an MSB program operation.

Although not illustrated in figures, flag and redundant cell regions 220 and 290 may be configured similar to the flag cell strings illustrated in FIG. 6.

Control logic unit 270 may be configured to control an overall operation of the nonvolatile memory device. For example, control logic unit 270 may control word line voltage generator 280 and page buffer 240 in response to judgment signal MSB_PGM from judgment unit 260. As described above, an LSB read algorithm for reading LSB data differs from an MSB read algorithm for reading MSB data. Accordingly, control logic unit 270 may select either one of the LSB and MSB read algorithms based on judgment signal MSB_PGM and control word line voltage generator 280 and page buffer 240 according to the selected read algorithm. Word line voltage generator 280 is controlled by control logic unit 270, and may be formed to generate word line voltages according to a mode of operation. The word line voltages may be supplied to row decoder 230.

As can be understood from the above description, judgment unit 260 is configured to replace abnormal flag cell strings with redundant cell strings.

Figure 9:
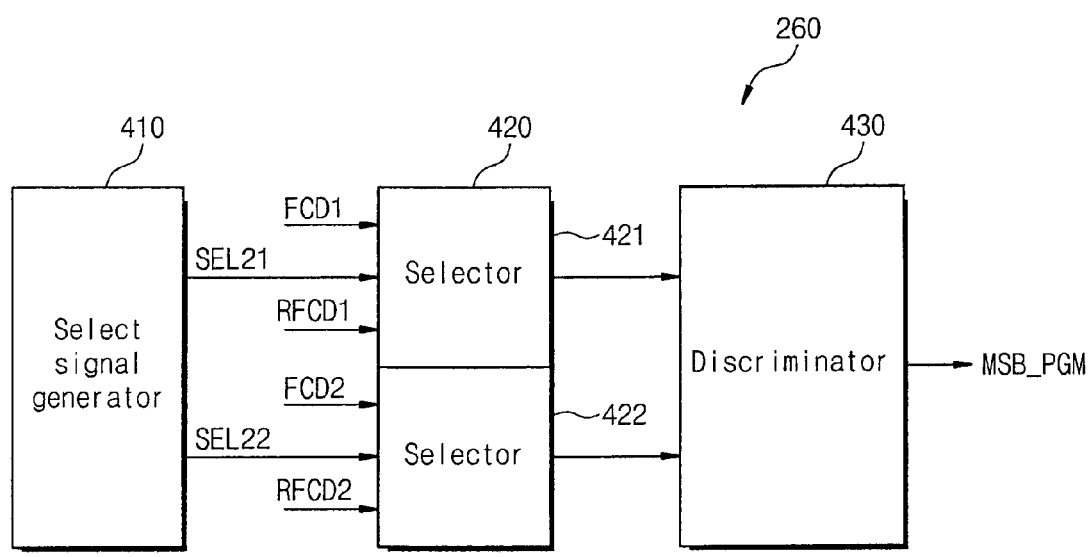
FIG. 9 is a block diagram illustrating an embodiment of a judgment unit illustrated in FIG. 8.

FIG. 9 is a block diagram illustrating a judgment unit illustrated in FIG. 8 according to another embodiment of the present invention. For explanation purposes, it will be assumed that each of flag cell region 220 and redundant cell region 290 comprises two strings. However, those skilled in the art will recognize that the number of strings in each of flag cell region 220 and redundant cell region 290 may be varied.

Referring to FIG. 9, judgment unit 260 includes a select signal generator unit 410, a selector unit 420, and a discriminator unit 430. In this example, select signal generator unit 410 generates two second select signals SEL21 and SEL22 based on whether each of two redundant cell strings operates normally.

For example, where one of the two flag cell strings is abnormal, a second select signal (e.g., SEL21) corresponding to the abnormal flag cell string may be set to logic state '1'. Otherwise, second control signal (e.g., SEL21) may be set to logic state '0'.

For example, where one of the flag cell strings connected respectively to flag bit lines FBL0 and FBL1 is abnormal (e.g., a string corresponding to flag bit line FBL1), one of second select signals SEL21 and SEL22 (e.g., SEL22) may be set to logic state '1'. Otherwise, second select signal SEL22 may be set to logic state '0'.

Select signal generator unit 410 may comprise fuses that are selectively cut according to whether flag cell strings 221 and 223 corresponding to flag bit lines FBL0 and FBL1 are normal. That is, second select signals SEL21 and SEL22 may be set to different values by cutting or not cutting the fuses.

For example, select signal generator unit 410 may output a logic level "high" ('1') where a fuse corresponding to an abnormal flag cell string is cut, and a logic level "low" ('0') where a fuse corresponding to a normal flag cell string is not cut.

Selector unit 420 includes selectors 421 and 422 corresponding to flag bit lines FBL0 and FBL1, respectively. Each of selectors 421 and 422 receives flag cell data read from a corresponding flag cell string and redundant cell data read from a corresponding redundant cell string. Each of the selectors 421 and 422 may output either one of received flag cell data and redundant cell data in response to a corresponding select signal.

For example, where a corresponding select signal has logic state '0' (or, where it is normal), selector unit 420 may output flag cell data read from a corresponding flag cell string. Where a corresponding select signal has logic state '1' (or, where it is abnormal), selector unit 420 may output redundant cell data read from a corresponding redundant cell string.

In other words, flag cell data read from an abnormal flag cell string may be replaced with corresponding redundant cell data when judging whether memory cells in a selected row are programmed with MSB data.

Discriminator unit 430 may judge whether memory cells in a selected row/word line are programmed with MSB data based on output signals of selectors 421 and 422. For example, where at least one of the output signals of selectors 421 and 422 has logic state '1', discriminator unit 430 may judge the memory cells in the selected row to be programmed with MSB data. Alternatively, where a majority of the output signals of the selectors 421 and 422 have logic state '1', discriminator unit 430 may judge the memory cells in the selected row to be programmed with MSB data. Alternatively, discriminator unit 430 may use other methods of analyses on the output signals of selectors 421 and 422 (e.g., unanimity, etc.) to judge whether the memory cells in the selected row are programmed with MSB data.

As a result, judgment unit 260 according to this embodiment of the invention can improve the reliability of flag data by replacing flag data read from abnormal flag cell strings with redundant cell data and reading flag data from a plurality of flag cell strings. Based on a judgment result of flag data thus obtained, the nonvolatile memory device may select and perform an algorithm for reading data stored in memory cell of a selected row.

The flag cells described above indicate whether a selected row of a memory cell array is MSB programmed. Those skilled in the art will recognize that similar effects to those of the above described embodiments can be obtained by performing various modifications on the flag cells, e.g., by changing the type and number of flag cells used, modifying their arrangement and location, and so on.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile memory device comprising:
   a memory cell array comprising memory cells arranged in a memory cell region, flag cells arranged in flag cell region, and redundant cells arranged in a redundant cell region, wherein the memory cells, flag cells and redundant cells are arranged in a common plurality of rows and in first, second, and third sets of columns corresponding respectively to the memory cell region, flag cell region, and redundant cell region;
   a page buffer configured to read at least one flag data bit from at least one of the flag cells in a selected row among the plurality of rows via at least one column in the second set of columns; and,
   a judgment unit configured to judge whether memory cells in the selected row are programmed with MSB data based on the at least one flag data bit read by the page buffer.

2. The nonvolatile memory device of claim 1, further comprising:
   a control logic unit configured to perform a read operation using a least significant bit (LSB) algorithm or a most significant bit (MSB) read algorithm based on a signal output by the judgment unit.

3. The nonvolatile memory device of claim 2, further comprising:
   a word line voltage generator controlled by the control logic unit and configured to generate word line voltages to be supplied to the memory cell array via a row decoder.

4. The nonvolatile memory device of claim 2, wherein during a MSB program operation directed to the selected row, at least one of the flag cells in the selected row are each programmed with a flag data bit via the page buffer under the control of the control logic unit.

5. The nonvolatile memory device of claim 1, wherein the judgment unit comprises:
   a select signal generator unit configured to generate at least one select signal indicating whether at least one of the flag cells in the flag cell region is functioning incorrectly;

selectors configured to output flag data bits read via the second set of columns in response to the at least one select signal; and a discriminator unit configured to output a judgment signal indicating whether memory cells in the selected row are programmed with MSB data, when at least one of the flag data bits output by the selectors indicates that MSB programming has been performed on the selected row.

6. The nonvolatile memory device of claim 5, wherein the select signal generator unit includes a plurality of fuses respectively corresponding to columns in the second set of columns, wherein values for the at least one select signal are determined according to respective connection states for the plurality of fuses.

7. The nonvolatile memory device of claim 1, wherein during a MSB program operation directed to the selected row, at least one of the redundant cells in the selected row are each programmed with a flag data bit via the page buffer under the control of the control logic unit.

8. The nonvolatile memory device of claim 1, wherein the redundant cells in redundant cell region are used to repair corresponding flag cells in the flag cell region.

9. The nonvolatile memory device of claim 8, wherein a number of columns in the second set of columns is the same as a number of columns in the third set of columns.

10. The nonvolatile memory device of claim 1, wherein the judgment unit comprises:

a select signal generator unit configured to generate at least one select signal indicating whether at least one column in the second set of columns is replaced with at least one column in the third set of columns;

selectors configured to output flag data bits read via the at least one column in the second set of columns and redundant data bits read via the at least one column in the third set of columns in response to the at least one select signal; and a discriminator unit configured to output a judgment signal indicating whether memory cells in the selected row are programmed with MSB data, when at least one of the flag data bits output by the selectors indicates that MSB programming has been performed on the selected row.

11. The nonvolatile memory device of claim 10, wherein the select signal generator unit comprises a plurality of fuses corresponding respectively to columns in the third set of columns, wherein values for the at least one select signal are determined according to corresponding connection states for the plurality of fuses.

* * * * *